United States Patent [19]

Mahmoud et al.

[11] Patent Number: 4,750,262
[45] Date of Patent: Jun. 14, 1988

[54] METHOD OF FABRICATING A PRINTED CIRCUITRY SUBSTRATE

[75] Inventors: Issa S. Mahmoud; Gustav Schrottke, both of Austin, Tex.

[73] Assignee: International Business Machines Corp., Armonk, N.Y.

[21] Appl. No.: 857,870

[22] Filed: May 1, 1986

[51] Int. Cl.⁴ .............................................. H05K 3/30
[52] U.S. Cl. ........................................ 29/832; 29/827; 148/11.5 A; 148/11.5 N; 428/469
[58] Field of Search .................. 29/827, 832; 428/469; 148/11.5 A, 11.5 N

[56] References Cited

U.S. PATENT DOCUMENTS

| 3,423,821 | 1/1969 | Nishimura | 29/832 X |
| 3,469,953 | 9/1969 | St. Clair et al. | 29/827 X |
| 3,559,285 | 2/1971 | Kauffman | 29/827 |
| 4,500,605 | 2/1985 | Fister et al. | 428/469 |
| 4,542,259 | 9/1985 | Butt | 29/827 X |
| 4,649,083 | 3/1987 | Fister et al. | 428/469 |

FOREIGN PATENT DOCUMENTS

| 58-71645 | 4/1983 | Japan | 29/827 |
| 58-96758 | 6/1983 | Japan | 29/827 |
| 59-25257 | 2/1984 | Japan | 29/827 |
| 60-59758 | 4/1985 | Japan | 29/827 |
| 60-211966 | 10/1985 | Japan | 29/827 |

Primary Examiner—P. W. Echols
Assistant Examiner—Carl J. Arbes
Attorney, Agent, or Firm—Andrea P. Bryant

[57] ABSTRACT

A composite substrate suitable for use as substrates for printed circuitry to which surface mountable components may be attached is disclosed. The substrate material comprises an alloy having a low coefficient of thermal expansion, to which aluminum is laminated and which is subsequently surface treated to produce a dielectric layer suitable to receive printed circuitry.

10 Claims, 2 Drawing Sheets

METHOD OF FABRICATING A PRINTED CIRCUITRY SUBSTRATE

DESCRIPTION

1. Technical Field

The present invention relates to dielectric substrates for printed circuitry. More particularly it relates to a process for fabricating a metallic substrate having a low coefficient of thermal expansion which substrate is subsequently surface treated to produce a dielectric layer so as to render the substrate suitable for use in circuit packaging applications.

2. Background Art

U.S. Pat. No. 4,427,993 discloses thermal expansion matching element comprising a body of aluminum having a low thermal and electrical impedance with a plate like configuration having first and second surfaces. The first surface is adapted for joining with a thermally and electrically transmissive housing element and the second surface has a lattice of thermal coefficient of expansion modifying iron nickel alloy material.

U.S. Pat. No. 4,089,709 discloses an aluminum layer made passive by oxidizing the aluminum to form a thin layer of amorphous alumina.

IBM *Technical Disclosure Bulletin,* Vol. 10, No. 2, July 1967, page 160 discloses oxidizing an aluminum layer on silicon dioxide film.

U.S. Pat. No. 4,427,993 uses a perforated matrix in which low expansion rate material is placed and a semiconductor is mounted directly on that material after plating with nickel. Other art conventionally teaches sputtering, plating or otherwise depositing aluminum which is used for electrical conduction.

Copper clad steel alloys have been used in circuit manufacture steps. Such materials are expensive and heavy and are used as a stiffener. Such material is not suitable for direct component attachment.

DISCLOSURE OF THE INVENTION

The present invention provides a process for producing a clad material and a dielectric layer thereon so that the composite substrate has a low thermal coefficient of expansion. This feature compensates for thermal mismatch between the substrate and semiconductor devices mounted thereon. The process includes laminating aluminum strips onto the alloy and heat treating the composite structure to cause diffusion of the aluminum into the alloy. The resultant clad material is preferably used as a circuit board substrate.

BRIEF DESCRIPTION OF THE DRAWINGS

Various features and advantages of the present invention will be understood from the following more detailed description taken in connection with the drawing in which.

BEST MODE FOR CARRYING OUT THE INVENTION

Figure 1:
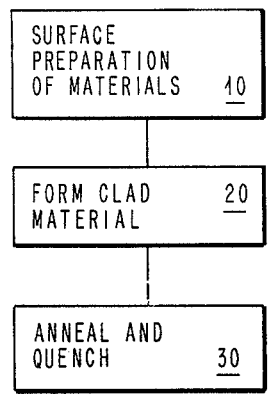
FIG. 1 is a block diagram of the inventive process.

FIG. 1 schematically illustrates the process of the present invention wherein a strip or sheet of an alloy such as Alloy 42 (42% nickel and 58% iron) is to be clad with strips or sheets of aluminum. All materials must be surface treated as represented by process step 10. A composite structure of alloy between aluminum is preferably hot rolled to form clad material as represented by process block 20. The resulting clad structure is annealed as represented by process block 30.

The object of the surface preparation step 10 is to have rough surfaces free of oxides, oil, dirt or any other contaminates. Conventional techniques may be used as discussed in metal finishing handbooks such as Heat Treating, Cleaning and Finishing Metals, American Metals Society 8th Edition, 1974, section on Cleaning and Finishing NonFerrous Metals which lists several chemical and/or mechanical treatments. A preferred treatment includes sand blasting the surfaces of both materials which are then cleaned as represented in a caustic solution having a pH preferably in the range of 10 to 12 for three to five minutes at a temperature of 140° to 160° F. The materials are treated in a deoxidizing solution, preferably of sulfuric and nitric acids which is about 5% by volume nitric acid and 10% by volume sulfuric acid, the balance by volume of water. A water rinse step which may be preferably carried out in a three stage apparatus next follows. Lastly, the materials may be allowed to air dry.

Figure 2:
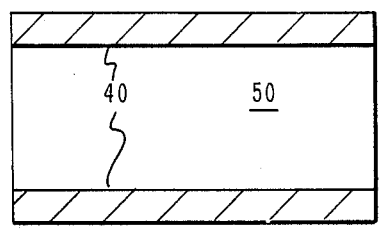
FIG. 2 shows a cross-section of the material produced by the process of the present invention.

Refer now to FIG. 2 which illustrates the clad material formed at step 20 in FIG. 1 preferably by hot rolling the composite structure of three strips or sheets, two of aluminum 40 sandwiching one of an alloy 50 having a low thermal coefficient of expansion therebetween. The hot rolling step is used to laminate the aluminum to the alloy and preferably takes place in a reducing atmosphere utilizing stainless steel rollers heated to a temperature of in the range of about 600° to 900° F. Rolling pressure is chosen as a function of the yield strength of the aluminum used. In this preferred embodiment Alloy 1100 (99.5% aluminum, 0.2% silicon, 0.2% iron and traces of titanium and magnesium) was used and it required about three kilopounds per square inch pressure. The anneal step 30, FIG. 1, preferably occurs at a temperature in the range of about 500° to 700° F. for one to five minutes. The resultant clad material is then quenched by cooling in air at room temperature.

Referring again to FIG. 2 the resultant material is shown in cross-section wherein the alloy 50 is about 500 to 750 micrometers thick and the aluminum 40 clad to the alloy 50 is about 125 to 250 micrometers thick.

When the structure shown in FIG. 2 is advantageously used for printed circuitry the core material 50 of the composite provides a thermal match between electronic packages and the substrate. Aluminum 40 cladding material aids in the control of thermal management problems when the composite is used as a substrate for printed circuitry.

The advantages of using such a substrate for printed circuitry include the ability to control thermal expansion as well as providing for higher thermal conduction. This property enhances the reliability of surface mounted components due to a significant reduction in thermal stresses imparted thereto. there is no alpha particle emission so that the reliability of memory devices mounted on this substrate is improved. The manufacturing steps for producing the substrate are simple with such simplification having an inherent cost reduction. Additionally, built in heat sink and ground plane capability exists.

The process of the present invention preferably contemplates using strips of varying width of the low expansion alloy 50 to which aluminum 40 having a thickness of 5 to 10 mils are laminated by hot rolling. To make layered substrate bodies requires using sheets of core material alloy and sheets, rather than strips, of aluminum to complete the composite structure. Both strips and sheets have been successfully used depending on the desired size of the resultant substrate. The subsequent heat treatment step allows diffusion of the aluminum into the low expansion alloy. The aluminum laminates, however, may be converted to alumina using other techniques such as electrolyte processes or electric discharge in an oxygen atmosphere.

Using the resultant structure for printed circuitry substrates is advantageous because the thermal coefficient of expansion of alumina alloy 42 and silicon are rather close. At operating temperatures the coefficient for silicon is between 2.3 and 3 PPM. For alumina alloy 42 the value is about 4 to 6 PPM.

Figure 3:
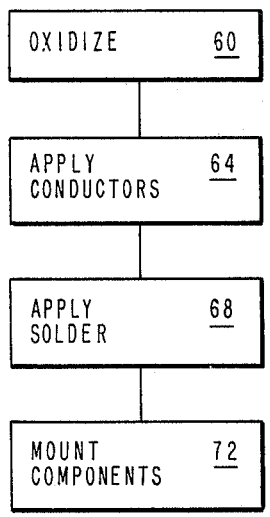
FIG. 3 illustrates successive steps in mounting components to a substrate made by the process of the present invention.

The material shown in FIG. 2 produced by the process represented in FIG. 1 of the present invention may be subjected to different circuitizing operations. For use on hybrid applications four steps illustrated in FIG. 3 are used to circuitize a substrate made in accordance with the process illustrated in FIG. 1. The process steps illustrated in FIG. 3 are conventional in nature. Block 60 represents the need for oxidizing the aluminum layer 40 in the composite structure to form a dielectric layer aluminum oxide. To this layer conductive material is applied as by screening. This step is represented at block 64. Next, solder and/or adhesive may be applied using conventional techniques. This operation is represented at block 68. Finally, at block 72 components are mounted.

Figure 4:
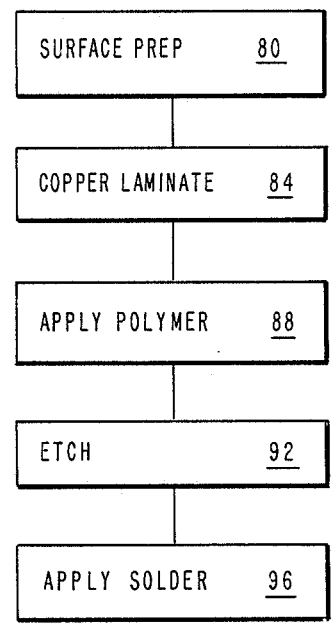
FIG. 4 shows successive steps in a different method for mounting components to a substrate made in accordance with the present invention.

FIG. 4 illustrates a method used when flex circuits and polymer applications are desired. Process block 80 represents the need for surface preparation of the clad material illustrated in FIG. 2. a layer of organic dielectric material is applied over the cleaned surface of aluminum; Next, copper is laminated to at least one surface as represented at block 54. A polymer layer is applied, block 88, over the copper. An etching step follows as shown at block 92 to create the conductive lines on the substrate. Solder is applied as by screening at block 96 and components are again mounted using conventional techniques.

Figures 5, 6:
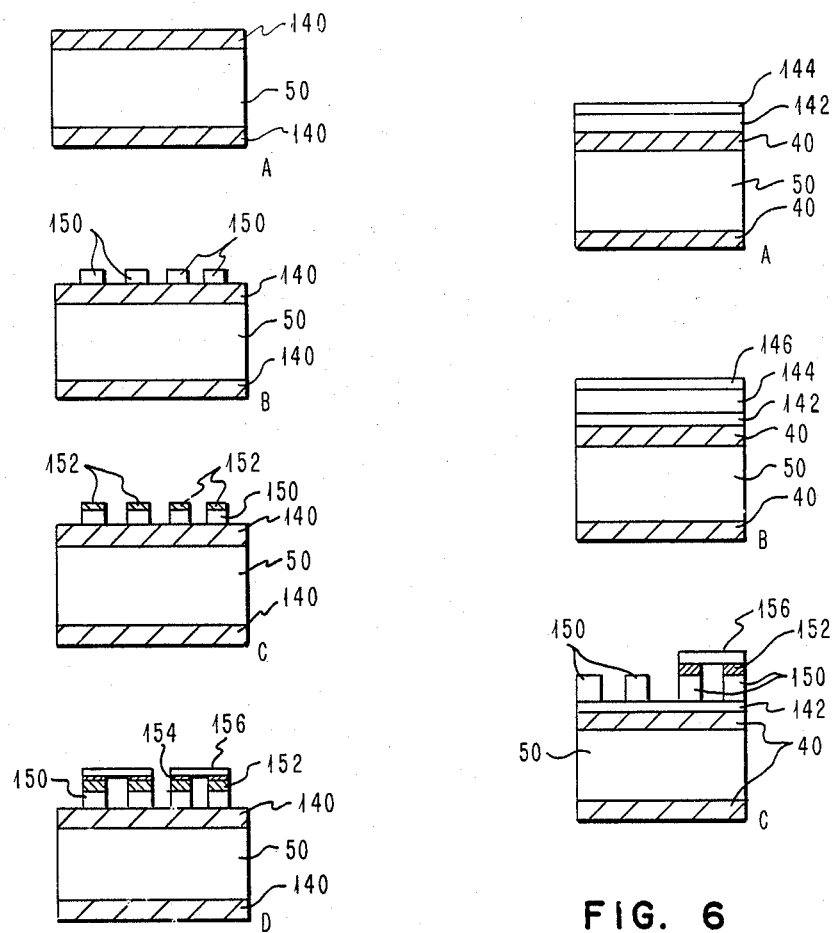
FIGS. 5a-d, and 6a-c, illustrate in cross section the result of performing the steps in FIG. 3 or FIG. 4.

Refer now to FIG. 5 which illustrates the structure resulting when the process steps of FIG. 3 are performed on the composite substrate structure of FIG. 2. After the oxidizing step 60 of FIG. 3, both aluminum layers 40 have been oxidized to form dielectric layers 140 in FIG. 5A. Following conventional printed circuitry screening techniques, conductive lines 150 are applied and shown in FIG. 5B. (Step 64, FIG. 3) FIG. 5C illustrates the structure after step 68 of FIG. 3 has occurred and solder, or as the case may be adhesive, 152 is placed on conductors 150. Components 156 are then placed as indicated in step 72 of FIG. 3.

FIG. 6 represents, step by step, the structrue resulting from following the conventinal printed circuitry process steps illustrated in FIG. 4. FIG. 5A shows the composite structure of FIG. 2 after the surface preparation, copper lamination, and polymer apply steps 80, 84, 88 respectively of FIG. 4 have occured. A layer of an organic dielectric material 142 is applied over one aluminum layer 40, and a layer of copper 144 has been provided therover. In FIG. 5B, a layer of dielectric polymer 146 is shown over copper layer 144. After conventional exapse and etch steps, copper circuitry lines 150 remain as shown in FIG. 6C. Electronic components 156 (one shown) are attahed with solder 152. While the invention has been described having reference to a particular embodiment and shown having particular utility as the substrate surface mountable electronic components, various changes in form and detail and process parameter boundaries may be made without departing from the spirit and scope of the invention.

What is claimed is:

1. A method of fabricating a substrate from an alloy having a low thermal coefficient of expansion and substantially pure aluminum for printed circuitry adapted to have semiconductor devices mounted to the surface thereof comprising the steps of:
   surface treating the alloy and aluminum;
   sandwiching planar alloy member between planar aluminum members;
   laminating the aluminum to the alloy to form a composite structure;
   heat treating the composite structure to cause diffusion of aluminum into the alloy; and
   annealing the composite structure.

2. The method of claim 1 wherein the alloy having a low coefficient of thermal expansion is a nickel steel alloy having a thickness in the range about 500 to 750 micrometers.

3. The method of claims 1 or 2 wherein the laminating step includes laminating aluminum having a thickness in the range of about 125 to 250 micrometers.

4. The method of claims 1 or 2 wherein the laminating step comprises hot rolling the composite structure of aluminum-alloy-aluminum.

5. The method of claims 1 or 2 wherein the hot rolling step includes maintaining steel rollers at a temperature in the range of from about 600° to 900° F. in a reducing atmosphere.

6. The method of claims 1 or 2 wherein the annealing step comprises placing the laminated structure in 500° to 700° F. for one to five minutes.

7. The method of claim 1 including the additional step of:
   forming at least one dielectric layer on the composite structure by oxidizing at least one of the external surfaces of the composite structure.

8. The method of claim 1 including the additional step of:
   applying an organic dielectric material to at least one of the aluminum surfaces of the composite structure.

9. The method of claim 7 including the additional steps of:
   applying conductive patterns to at least one of the dielectric layers of the composite structure; and
   attaching electronic component devices to the applied conductive patterns.

10. The method of claim 8 including the additional steps of:
    providing a layer of copper on the composite structure;
    providing a dielectric polymer layer over the copper layer;
    selectively etching areas of the copper layer to form conductive patterns; and
    attaching electronic components to the conductive patterns.

* * * * *